United States Patent [19]

Kazami

[11] Patent Number: 4,737,672

[45] Date of Patent: Apr. 12, 1988

[54] HYBRID INTEGRATED CIRCUIT MAGNETIC SUBSTRATE FOR MOTOR OR GENERATOR CIRCUIT

[75] Inventor: Akira Kazami, Tochigi, Japan

[73] Assignee: Sanyo Electric Co., Ltd., Japan

[21] Appl. No.: 947,813

[22] Filed: Dec. 30, 1986

[30] Foreign Application Priority Data

Jan. 16, 1986 [JP] Japan ................... 61-6659

[51] Int. Cl.⁴ .......................................... H07K 11/00
[52] U.S. Cl. .................... 310/68 R; 310/71; 310/DIG. 6; 357/27
[58] Field of Search ............... 310/68 R, 71, DIG. 6, 310/68 C, 72, 67 R, 88, 268; 357/27

[56] References Cited

U.S. PATENT DOCUMENTS

| | | | |
|---|---|---|---|
| 3,895,391 | 7/1975 | Konishi | 357/27 |
| 4,541,894 | 9/1985 | Cassat | 428/402 |
| 4,602,318 | 7/1986 | Lassen | 361/414 |
| 4,620,139 | 10/1986 | Egami et al. | 310/68 R |
| 4,654,248 | 3/1987 | Mohammed | 428/408 |
| 4,667,122 | 5/1987 | Müller | 310/268 |

FOREIGN PATENT DOCUMENTS 52-112572 9/1977 Japan .

*Primary Examiner*—Patrick R. Salce
*Assistant Examiner*—D. L. Rebsch
*Attorney, Agent, or Firm*—Darby & Darby

[57] ABSTRACT

A hybrid integrated circuit substrate for a motor is formed by an iron substrate (1), a resin layer (2) adhered on the same and a copper foil layer (3) adhered on the same. The resin layer (2) is formed of epoxy resin, and Kevlar fiber belonging to aromatic polyamide fiber is mixed therein in the form of cloth or paper. Thus, a clad formed by the resin layer (2) and the copper foil layer (3) has a thermal expansion coefficient close to that of the iron substrate (1), thereby to prevent warping caused in manufacturing of the hybrid integrated circuit substrate. The copper foil layer (3) is etched in prescribed configurations to form conductive paths (13), to which stator coils (5) and various circuit elements (14, 15) are connected.

18 Claims, 4 Drawing Sheets

HYBRID INTEGRATED CIRCUIT MAGNETIC SUBSTRATE FOR MOTOR OR GENERATOR CIRCUIT

BACKGROUND OF THE INVENTION

1. Field of the Invention

The present invention relates to a hybrid integrated circuit substrate, and more specifically, it relates to a hybrid integrated circuit substrate to which a magnetic circuit for a motor or the like is assembled.

2. Description of the Prior Art

FIG. 1 is a perspective view showing an example of a conventional integrated circuit substrate, which is disclosed in Japanese patent publication Gazette No. 13234/1971, for example.

Description is now made on the structure of the conventional integrated circuit substrate as shown in FIG. 1.

Referring to FIG. 1, a thin layer 22 of aluminum oxide is formed through anodic oxidation on at least one major surface of an aluminum substrate 21. On the thin aluminum oxide layer 22, conductive paths or conductor fixing portions 27 and circuit elements such as resistors 23 and 24 are formed by selectively depositing resistor materials and good conductive materials. A good thermoelectric member is deposited on the thin aluminum oxide layer 22 to form a lead portion 26, and a transistor pellet 25 is adhered to the same. External conductors (not shown) are connected to the conductor fixing portions 27.

While a hybrid integrated circuit substrate assembled with a magnetic circuit for a motor has been put into practice, the integrated circuit substrate as shown in FIG. 1 including an aluminum substrate cannot be applied to such a hybrid integrated circuit substrate for a motor since the aluminum substrate allows no passage of magnetic lines of force.

There has been proposed a hybrid integrated circuit substrate for a motor in which the aforementioned aluminum substrate is replaced by an iron substrate which passes magnetic lines of force.

FIG. 2 is a sectional view schematically showing an example of such a hybrid integrated circuit substrate employing an iron substrate.

Referring to FIG. 2, a resin layer 29 of epoxy resin or the like is adhered on the surface of an iron substrate 28, and a copper foil layer 30 is adhered to the resin layer 29. The copper foil layer 30 is etched to form conductive patterns for fixing electronic components or the like, thereby to form a hybrid integrated circuit substrate for a motor.

For example, Japanese patent Laying-Open Gazette No. 46304/1979 discloses a motor employing a hybrid integrated circuit substrate based on such an iron substrate. In such a motor, an insulating base material is adhered on the iron substrate serving as a magnetic path material through an adhesive agent, and an interconnection pattern layer is formed on the insulating base material.

In the hybrid integrated circuit substrate based on the iron substrate as shown in FIG. 2, however, the thermal expansion coefficients of iron, epoxy resin and copper are $11\times10^{-6}/°$ C., $60\times10^{-6}/°$ C. and $18\times10^{-6}/°$ C. respectively, which values are extremely different from each other. Particularly the thermal expansion coefficient of epoxy resin is extremely large, whereby the substrate is warped toward the copper side in manufacturing of the hybrid integrated circuit substrate. As the result, it is extremely difficult to form patterns on the substrate.

Further, warping takes place in a thermo cycle, to cause a problem in reliability of fittings.

In addition, the distance between coils and a rotor is changed by the warping of the substrate to exert a bad influence on rotation of the motor, leading to irregular rotation.

In the conventional hybrid integrated circuit substrate for a motor such as that disclosed in the aforementioned Japanese patent Laying-Open Gazette No. 46304/1979, further, the insulating base material for supporting the circuit elements or the like is formed independently of the iron substrate to be then adhered to the iron substrate by an adhesive agent or the like. Thus, the insulating base material itself must have considerable mechanical strength, i.e., considerable thickness in order to support the circuit elements or the like on the insulating base material, whereby a space between the iron substrate and a magnetic circuit is increased.

SUMMARY OF THE INVENTION

Briefly stated, provided according to the present invention is a hybrid integrated circuit substrate which comprises a magnetic substrate, a resin layer formed on the magnetic substrate and containing aromatic polyamide fiber mixed therein and a copper foil layer formed on the resin layer.

According to another aspect of the present invention a motor comprises a hybrid integrated circuit substrate having a magnetic substrate, a resin layer formed on the magnetic substrate and containing aromatic polyamide fiber mixed therein and a copper foil layer formed on the resin layer and having conductive paths of prescribed patterns, stator coils arranged on the resin layer to be connected with the conductive paths, magnetic circuit elements arranged on the resin layer to be connected with the conductive paths, bearing means formed on the hybrid integrated circuit substrate, a rotor case having a rotor shaft supported by the bearing means and a rotor magnet provided in the rotor case to be opposite to the stator coils with a prescribed axial space.

According to still another aspect of the present invention, the magnetic substrate is an iron substrate.

According to a further aspect of the present invention, the resin layer is formed of epoxy resin.

According to a further aspect of the present invention, the ratio in thickness of the copper foil layer to the resin layer is within a range of about 0.1 to 0.7.

According to a further aspect of the present invention, the aromatic polyamide fiber has a thermal expansion coefficient of about $-2\times10^{-6}/°$ C.

Accordingly, a principal object of the present invention is to provide a hybrid integrated circuit substrate which can remarkably suppress occurrence of warping in the manufacturing steps.

Another object of the present invention is to provide a hybrid integrated circuit substrate which can reliably support circuit elements and the like by mechanical strength of the iron substrate while employing a thin resin layer.

A principal advantage of the present invention is that the thermal expansion coefficient of the resin layer can be made extremely close to that of the magnetic substrate such as an iron substrate by mixing aromatic polyamide fiber having a minus thermal expansion coefficient into the resin layer, thereby to suppress warping of the substrate.

Another advantage of the present invention is that pattern working on the substrate can be simplified by suppressing warping of the substrate.

Still another advantage of the present invention is that reliability of fit is improved by suppressing warping of the substrate.

A further advantage of the present invention is that the distance between coils and a rotor of a motor provided on the substrate can be maintained constant by suppressing warping of the substrate, thereby to prevent irregular rotation of the motor.

A further advantage of the present invention is that the circuit elements and the like can be supported by supporting ability of the iron substrate since the iron substrate is integrally formed with the resin layer and the copper foil layer, whereby no mechanical strength, i.e., thickness of the resin layer itself is required.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
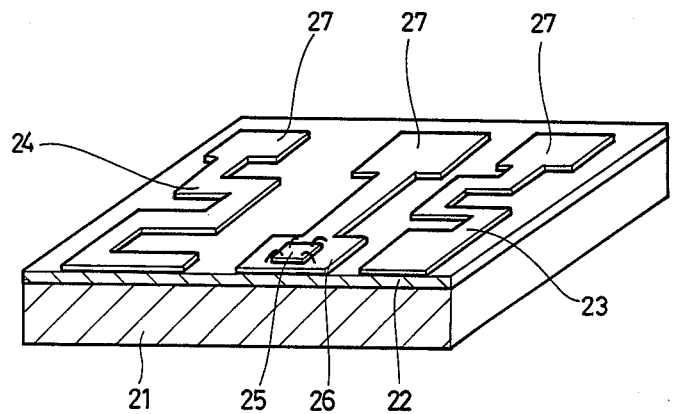
FIG. 1 is a perspective view showing an example of a conventional integrated circuit substrate.
Figure 2:
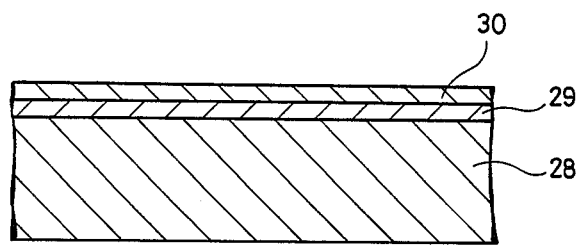
FIG. 2 is a sectional view showing an example of a conventional hybrid integrated circuit substrate employing an iron substrate.
Figure 3:
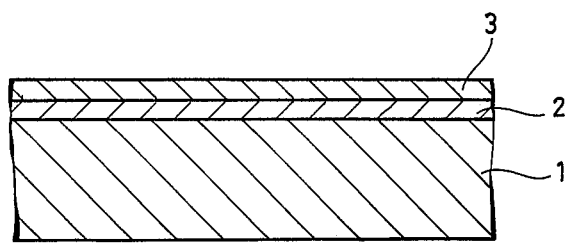
FIG. 3 is a sectional view showing a hybrid integrated circuit substrate according to an embodiment of the present invention.

FIG. 3 is a sectional view showing a hybrid integrated circuit substrate according to an embodiment of the present invention.

Description is now made of the structure on the hybrid integrated circuit substrate as shown in FIG. 3.

Referring to FIG. 3, a resin layer 2 containing aromatic polyamide fiber is formed on one major surface of a magnetic substrate 1, and a copper foil layer 3 is formed on the resin layer 2.

An iron substrate of 0.35 to 1.0 mm in thickness is employed as a ferromagnetic material for forming the magnetic substrate 1. The resin layer 2 is formed by mixing aromatic polyamide fiber into an epoxy resin layer, and the said aromatic polyamide fiber is preferably Kevlar (trade name: Du Pont & Co., Inc.) whose thermal expansion coefficient is extremely low, $-2 \times 10^{-6}/°$ C.

Kevlar has been provided as a reinforcing agent for plastics, and is applicable to various industrial materials such as ropes, cables and protective clothing. Tensile strength of Kevlar exceeds twice that of nylon or Dacron (polyester) and is superior at least by 20% to E glass. Further, Kevlar has the highest relative tensile strength among the existing materials. The thermal expansion coefficient thereof is in a minus value of $-2 \times 10^{-6}/°$ C., as hereinabove described. The present invention has been provided with attention drawn to the fact that aromatic polyamide fiber such as Kevlar has an extremely low, i.e., negative thermal expansion coefficient.

Description is now made on a method of manufacturing the hybrid integrated circuit substrate as shown in FIG. 3, in which Kevlar is employed as the aromatic polyamide fiber.

First, Kevlar in the form of cloth or paper is dipped in a solution obtained by dissolving epoxy resin by a solvent. After being impregnated with the epoxy resin, the Kevlar is taken out from the solution to be dried, thereby to form the resin layer 2. The thermal expansion coefficient of the resin layer 2 thus formed is 6 to $10 \times 10^{-6}/°$ C., which is much lower than that of the conventional resin layer formed of epoxy resin alone.

Then the resin layer 2 formed in the aforementioned manner is arranged on the iron substrate 1, and the copper foil layer 3 is arranged on the same. Thereafter the resin layer 2 and the copper foil layer 3 arranged on the iron substrate 1 are adhered to each other by a hot press method. Then the copper foil layer 3 is etched in desired configurations to form conductive paths, to be applied to a hybrid integrated circuit substrate for a motor.

Figure 4:
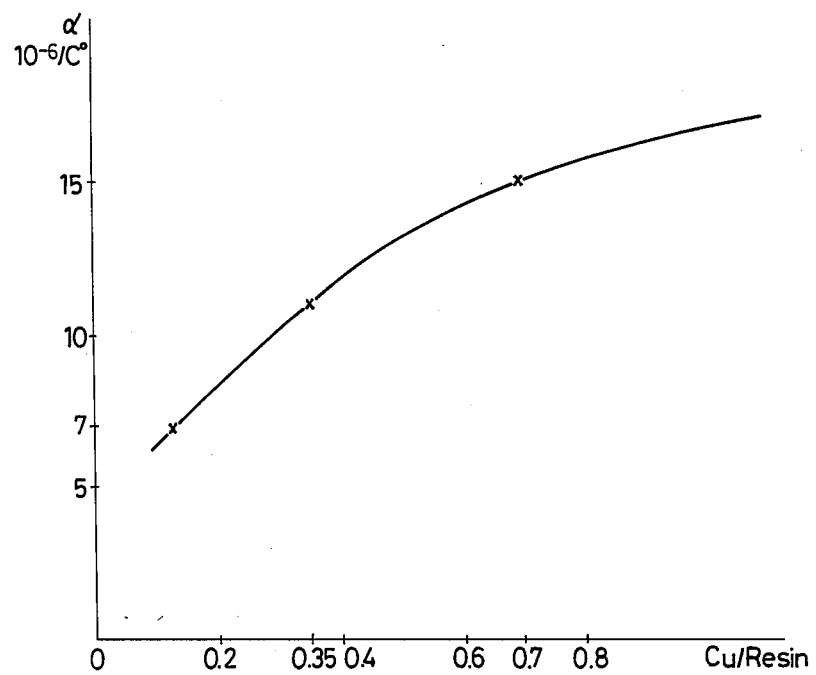
FIG. 4 is a graph showing relation between the ratio in thickness of a copper foil layer to a resin layer (Cu/Resin) and the thermal expansion coefficient $\alpha$ of a clad formed by the copper foil layer and the resin layer.

FIG. 4 is a graph showing the result of an experiment made on the thermal expansion coefficient $\alpha$ of a clad formed by the copper foil 3 and the resin layer 2 in case of varying the ratio (Cu/Resin) in thickness of the copper foil layer 3 to the resin layer 2.

Referring to FIG. 4, the axis of abscissa indicates the ratio Cu/Resin and the axis of ordinate indicates the thermal expansion coefficient $\alpha$ (in the units of $10^{-6}/°$ C.). In the experiment as shown in FIG. 4, measurement has been made on variation in the thermal expansion coefficient $\alpha$ of the clad (including no iron substrate 1) formed by the resin layer 2 and the copper foil layer 3 provided over the entire surface of the resin layer 2. The copper foil layer 3 has been provided over the entire surface of the resin layer 2 in order to set the worst condition against warping of the substrate, while the degree of such warping is improved in practice as compared with the case of forming the copper foil layer over the entire surface of the resin layer as shown in FIG. 4, since the copper foil layer 3 is partially etched to form the conductive paths. In the graph of FIG. 4, thickness of the copper foil layer 3 is maintained constant at 35 $\mu$m and thickness of the resin layer 2 is changed to be plotted. However, the thermal expansion coefficient $\alpha$ of the clad formed by the resin layer 2 and the copper layer 3 depends on the ratio Cu/Resin, and hence a similar result is obtained even if the thickness of the resin layer 2 is maintained constant while varying the thickness of the copper foil layer 3.

As hereinabove described, the warping of the substrate is caused by difference in thermal expansion coefficient between the layers forming the hybrid integrated circuit substrate. In order to prevent such warping, the thermal expansion coefficient α of the aforementioned clad is ideally equal to that of the iron substrate 1, i.e., $11 \times 10^{-6}/°$ C. As obvious from FIG. 4, the ratio Cu/Resin is 0.35 when the thermal expansion coefficient α is equal to $11 \times 10^{-6}/°$ C. Namely, when the thickness ratio of the clad is set at the said value, substantially no warping is caused on the hybrid integrated circuit substrate regardless of the temperature. For example, when warping in excess of ±1 mm is caused in a substrate of 30 cm in length, reproducibility is lost in pattern working. However, when the thermal expansion coefficient α is within an allowable range of 7 to $10 \times 10^{-6}/°$ C. as shown in FIG. 4, the warping is smaller than ±1 cm. Thus, the warping of the substrate can be made to be smaller than ±1 mm when the thickness ratio Cu/Resin is within the allowable range of about 0.1 to 0.7, to be applicable as a hybrid integrated circuit substrate for a motor.

Figure 5:
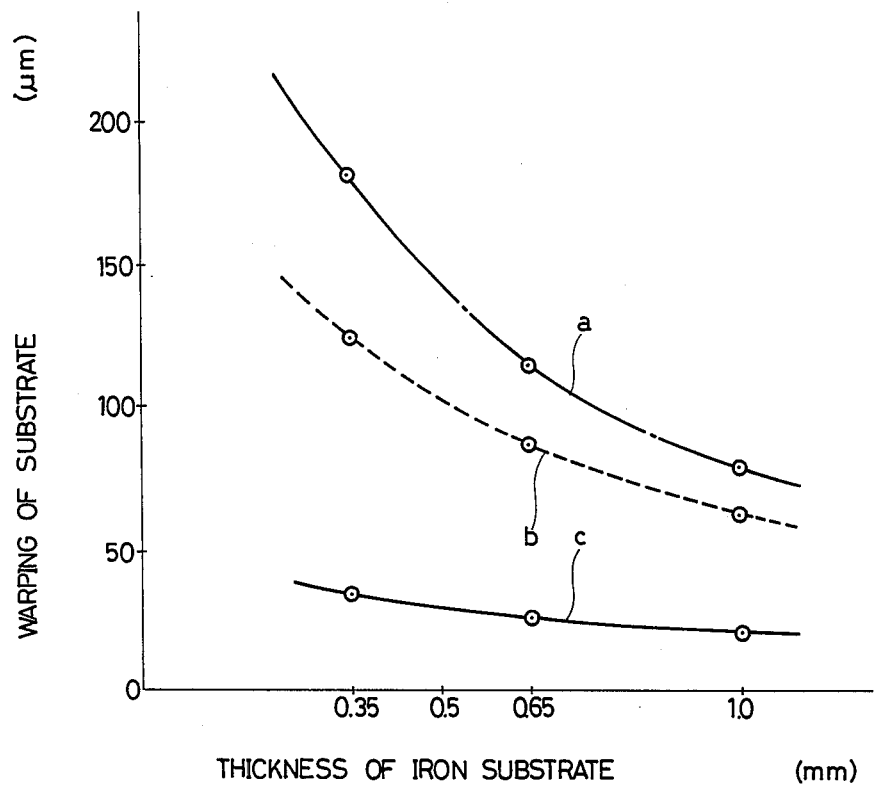
FIG. 5 is a graph showing relation between thickness of an iron substrate and warping of the substrate in case where the ratio in thickness of the copper foil layer to the resin layer is constantly at 0.7.

FIG. 5 is a graph showing relation between thickness of an iron substrate and warping of the substrate in case of maintaining the ratio in thickness of a copper foil layer to a resin layer constant. Referring to FIG. 5, the axis of abscissa indicates the thickness of the iron substrate and the axis of ordinate indicates the warping of the substrate. A curve a represents the case of employing a resin layer formed of epoxy resin alone (hereinafter referred to as epoxy layer) and a curve b represents the case of employing a resin layer of epoxy resin mixed with glass cloth (hereinafter referred to as glass epoxy layer) while a curve c represents the case of employing a resin layer of epoxy resin mixed with Kevlar fiber (hereinafter referred to as Kevlar epoxy layer). All of the respective said layers are 50 μm in thickness, and the components of the respective resin layers are as shown in the following Table:

TABLE

| Sample | Epoxy Component | Glass Cloth/ Kevlar Fiber |
|---|---|---|
| Epoxy Layer | NEMA GRADE FR-5 (50 g/m$^2$) | |
| Glass Epoxy Layer | NEMA GRADE FR-5 (36 g/m$^2$) | Glass Cloth (54 g/m$^2$) |
| Kevlar Epoxy Layer | NEMA GRADE FR-5 (38 g/m$^2$) | Kevlar Fiber (44 g/m$^2$) |

Further, copper foil layers of 35 μm in thickness are adhered over the entire surfaces of the aforementioned resin layers. Therefore, the ratio Cu/Resin in this case is 35 μm/50 μm=0.7, and in particular, the thermal expansion coefficient α of the Kevlar epoxy layer is $15 \times 10^{-6}/°$ C. from FIG. 4 in this case. The experiment of FIG. 5 has been made on substrates of 6 cm×6 cm in order to prevent influence exerted by dead loads of the substrates.

As obvious from FIG. 5, warping of the substrate is increased generally as the iron substrate is reduced in thickness. Particularly when the epoxy layer (curve a) and the glass epoxy layer (curve b) are employed as the resin layers, warping of the substrates is rapidly increased as the iron substrates are reduced in thickness. In case of such layers, therefore, warping is increased when the iron substrates are small in thickness to obstruct working of conductive patterns on the substrates, which cannot be applied to hybrid integrated circuit substrates for motors. In case of the Kevlar epoxy layer (curve c) according to the present invention, on the other hand, warping of the substrate is relatively small regardless of the change in thickness of the iron substrate.

According to the present invention, further, the resin layer is directly formed on the iron substrate to thereafter form conductive paths or mount circuit elements, whereby the circuit elements or the like can be sufficiently supported on the resin layer through mechanical strength of the iron substrate even if the resin layer is extremely small in thickness at about 50 μm for example, as hereinabove described.

Figure 6:
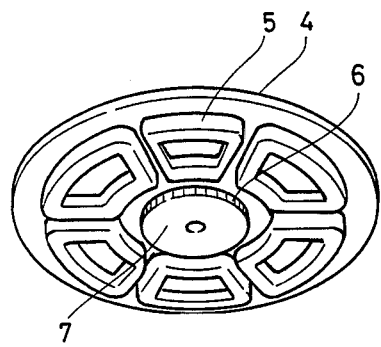
FIG. 6 is an exploded perspective view of a motor to which the hybrid integrated circuit substrate according to the present invention is applied.
Figure 6:
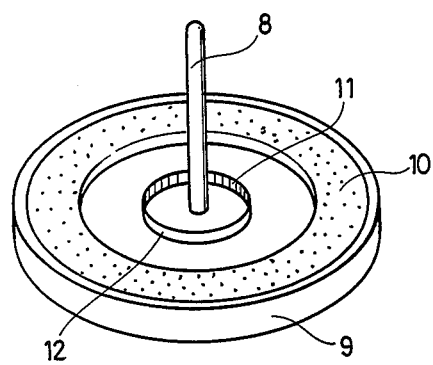
Figure 7:
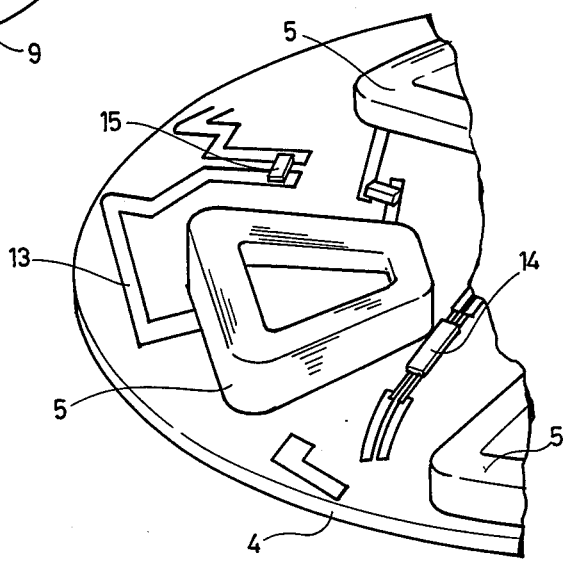
FIG. 7 is a partial enlarged view of the hybrid integrated circuit substrate forming the motor as shown in FIG. 6.

FIG. 6 is an exploded perspective view of a motor to which the hybrid integrated circuit substrate as shown in FIG. 3 is applied, and FIG. 7 is a partially enlarged view of the hybrid integrated circuit substrate as shown in FIG. 6.

Description is now made on the motor to which the present invention is applied with reference to FIGS. 6 and 7.

A hybrid integrated circuit substrate 4 of the structure as shown in FIG. 3 is formed in a prescribed configuration for a motor, to be provided on its one surface with a plurality of stator coils 5 in a substantially circular manner. Conductive paths 13 of prescribed configurations are previously formed on the surface of the hybrid integrated circuit substrate 4 through etching of the aforementioned copper foil layer 3, so that chip components such as a magnetic-sensitive element 14, an IC and a transistor and a resistor 15 are fixed to the conductive paths 13 as shown in FIG. 7. Simultaneously with this, the end portions of the respective stator coils 5 are connected with the conductive paths 13, thereby to drive the motor.

A holding cylinder (not shown) for a bearing is provided at the center of the hybrid integrated circuit 4, to be provided on its lower end with a generator stator portion 7 having generator coils and the like and being formed with irregular teeth 6 in its outer peripheral surface. A rotor shaft 8 supported by the aforementioned bearing is provided in its lower end with a rotor case 9, which contains a rotor magnet 10 opposite to the stator coils 5 with a prescribed axial space and a generator rotor portion 12 having irregular teeth 11 in its inner peripheral surface.

The irregular teeth 11 of the generator rotor portion 12 are radially opposite to the irregular teeth 6 of the generator stator portion 7, so that the space between the irregular teeth 6 and 11 is varied in length with rotation of the rotor. Namely, voltage having a frequency corresponding to the speed of rotation of the rotor is detected by inductive electromotive force generated on the generator coils by variation in the aforementioned space length in a magnetic path formed by the rotor magnet 10, the substrate 4, the holding cylinder and the irregular teeth 6 and 11.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A hybrid integrated circuit substrate for a motor circuit comprising:
   a magnetic substrate;
   a resin layer formed at least on one major surface of said magnetic substrate, said resin layer containing aromatic polyamide fiber mixed therein; and
   a copper foil layer formed on said resin layer;

the ratio between the thickness of said copper foil layer and said resin layer being in a range selected to conform the coefficient of expansion thereof to the coefficient of expansion of said magnetic substrate.

2. A hybrid integrated circuit substrate for a motor in accordance with claim 1, wherein
said magnetic substrate is a iron substrate.

3. A hybrid integrated circuit substrate for a motor in accordance with claim 2, wherein
said iron substrate is 0.35 to 1.0 mm in thickness.

4. A hybrid integrated circuit substrate for a motor in accordance with claim 1, wherein
said resin layer is an epoxy resin layer.

5. A hybrid integrated circuit substrate for a motor in accordance with claim 1, wherein
the ratio in thickness of said copper foil layer to said resin layer is within a range of about 0.1 to 0.7.

6. A hybrid integrated circuit substrate for a motor in accordance with claim 1, wherein
said aromatic polyamide fiber has a thermal expansion coefficient of about $-2 \times 10^{-6}/°$ C.

7. A hybrid integrated circuit substrate for a motor in accordance with claim 1, wherein
said aromatic polyamide fiber is mixed in said resin layer in the form of cloth.

8. A hybrid integrated circuit substrate for a motor in accordance with claim 1, wherein
said aromatic polyamide fiber is mixed in said resin layer in the form of paper.

9. A hybrid integrated circuit substrate for a motor in accordance with claim 1, wherein
said copper foil layer forms conductive paths of prescribed patterns.

10. A motor comprising:
a hybrid integrated circuit substrate including:
a magnetic substrate,
a resin layer formed on one major surface of said magnetic substrate, said resin layer containing aromatic polyamide fiber mixed therein, and
a cooper foil layer formed on said resin layer to form conductive paths of prescribed patterns, the ratio between the thickness of said copper foil layer and said resin layer being in a range selected to conform the coefficient of expansion thereof to the coefficient of expansion of said magnetic substrate;
stator coils arranged on said resin layer to be connected to said conductive paths;
magnetic circuit elements arranged on said resin layer to be connected to said conductive paths;
bearing means formed on said hybrid integrated circuit substrate;
rotor case having a rotor shaft supported by said bearing means; and
a rotor magnet provided in said rotor case to be opposite to said stator coils while defining a prescribed space in the axial direction between said stator coils and the same.

11. A motor in accordance with claim 10, wherein
said magnetic substrate is an iron substrate.

12. A motor in accordance with claim 11, wherein
said iron substrate is 0.35 to 1.0 mm in thickness.

13. A motor in accordance with claim 10, wherein
said resin layer is an epoxy resin layer.

14. A motor in accordance with claim 10, wherein
the ratio in thickness of said copper foil layer to said resin layer is within a range of about 0.1 to 0.7.

15. A motor in accordance with claim 10, wherein
said aromatic polyamide fiber has a thermal expansion coefficient of about $-2 \times 10^{-6}/°$ C.

16. A motor in accordance with claim 10, wherein
said aromatic polyamide fiber is mixed in said resin layer in the form of cloth.

17. A motor in accordance with claim 10, wherein
said aromatic polyamide fiber is mixed in said resin layer in the form of paper.

18. A hybrid integrated substrate in accordance with claim 1, said substrate being of the type in which said copper foil layer is formed into conductive paths of prescribed patterns, and further comprising:
stator and coils arranged on said resin layer to be connected to said conductive paths; and
magnetic circuit elements arranged on said resin layer to be connected to said conductive paths.

* * * * *